United States Patent
Robb et al.

(10) Patent No.: US 6,392,266 B1
(45) Date of Patent: May 21, 2002

(54) TRANSIENT SUPPRESSING DEVICE AND METHOD

(75) Inventors: Francine Y. Robb, Tempe; William E. Gandy, Jr., Phoenix; Alfredo Ochoa, Cave Creek; Jeffrey Pearse, Chandler, all of AZ (US)

(73) Assignee: Semiconductor Components Industries LLC, Phoenix, AZ (US)

( * ) Notice: Subject to any disclaimer, the term of this patent is extended or adjusted under 35 U.S.C. 154(b) by 0 days.

(21) Appl. No.: 09/768,579

(22) Filed: Jan. 25, 2001

(51) Int. Cl.[7] .............................................. H01L 29/76
(52) U.S. Cl. ..................... 257/314; 257/601; 257/603
(58) Field of Search ............................ 257/601, 355, 257/603; 361/56; 307/317

(56) References Cited

U.S. PATENT DOCUMENTS 5,164,615 A * 11/1992 Walter ......................... 307/317
5,245,412 A * 9/1993 Clark et al. .................. 257/601
5,274,524 A * 12/1993 Pezzani et al. ................ 361/56
6,188,109 B1 * 2/2001 Takahashi .................... 257/355

OTHER PUBLICATIONS

USB6Bx, Aug. 19, 1999, (pp.–9).
Low Capacitance Surface Mount TVS for High Speed Data Interfaces, Jan. 20, 1999, (7).

* cited by examiner

Primary Examiner—David Nelms
Assistant Examiner—Thinh T Nguyen

(57) ABSTRACT

A method is provided for suppressing a transient signal ($V_{TR}$) using a single semiconductor die (130). The method comprises the step of loading the transient signal with first and second junctions (110, 112) formed adjacent to a first doped region (140) of the semiconductor die. The first junction breaks down to generate a current while the second junction forward biases to route the current across an undepleted portion (161) of the first doped region and through the second junction.

20 Claims, 5 Drawing Sheets

TRANSIENT SUPPRESSING DEVICE AND METHOD

BACKGROUND OF THE INVENTION

The present invention relates in general to semiconductor devices and, more particularly, to monolithic transient voltage suppressor devices.

Transient voltage suppressors are used in a variety of electrical systems to prevent high voltage transients from damaging system components. For example, computer systems connect transient voltage suppressors across data and/or power lines to dissipate the energy induced by a transient event such as a noise pulse, a static discharge, or a lightning strike. The transient suppressors break down when a transient voltage exceeds a predetermined level, thereby limiting the voltage on the data and power lines and avoiding component damage. A typical transient suppressor breaks down when a transient voltage exceeds eight volts and shunts at least one ampere of current which would otherwise flow through other system components and lead to a destructive failure of the system.

Current transient voltage suppressors use large avalanche diodes to dissipate the current associated with the transient event. However, these avalanche diodes have the problem of high capacitance, which loads the data lines and slows down the data transfer rate. Other transient voltage suppressors reduce capacitance by coupling a low capacitance diode which is forward biased in series with the avalanche diode. Each diode is housed in a separate semiconductor package, which results in a high cost of manufacturing and using the suppressor. Yet other transient voltage suppressors mount both diodes in the same package and use wire bonds to interconnect the separate dice. Such a scheme reduces the cost of using the suppressors, but the manufacturing cost is still too high for many applications. Still other transient voltage suppressors are fabricated as punchthrough diodes in which the transient voltage depletes an entire doped region of a semiconductor die and "punches through" to an adjacent doped region. However, these devices have a low yield and high cost because of the difficulty in controlling both the doping level and distance across the doped region simultaneously. Moreover, punchthrough diodes have a high capacitance and therefore reduce system speed and performance.

Hence, there is a need for a transient voltage suppressor that is formed on a single semiconductor die to have a low cost and which has a low capacitance to maintain a high system performance.

DETAILED DESCRIPTION OF THE DRAWINGS

In the figures, elements having the same reference numbers have similar functionality.

Figure 1:
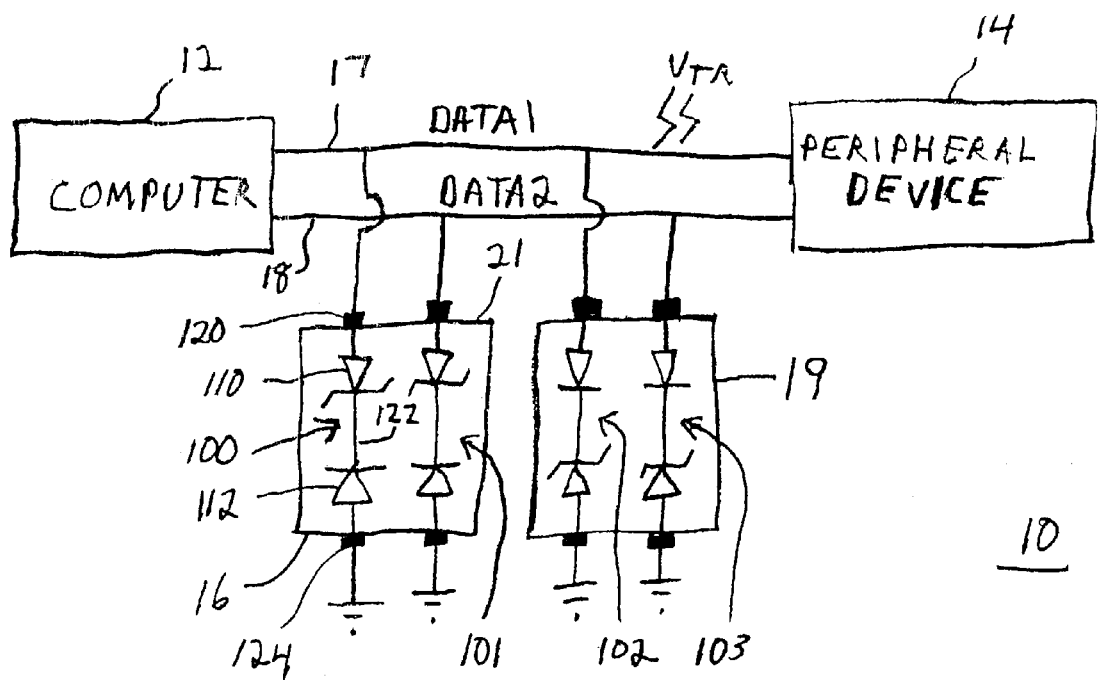
FIG. 1 shows a schematic diagram of an electrical system.

FIG. 1 is a schematic diagram of a computer system 10, including a computer 12, a peripheral device 14 and protection circuits 16 and 19. Computer 12 exchanges digital information with peripheral circuit 14 as DATA1 and DATA2 provided on data lines 17 and 18, respectively. DATA1 and DATA2 operate at a logic low level of about zero volts and a logic high level of about five volts.

Computer 12 and peripheral circuit 14 are low voltage devices which can incur damage if the potential on data lines 17 and/or 18 exceeds about eight volts, either positive or negative. Peripheral circuit 14 is remotely located with respect to computer 12, so data lines 17 and 18 have a long length and a high susceptibility to receiving a high voltage transient signal $V_{TR}$ from a lightning strike or other event such as a transient magnetic field or an electrostatic discharge.

Protection circuit 16 includes transient voltage suppressors 100 and 101, which are housed in a semiconductor package 21. Protection circuit 19 includes transient voltage suppressors 102 and 103. Transient voltage suppressors 100–103 are each configured as two serially coupled back-to-back diodes. For example, transient voltage suppressor 100 includes diodes 110 and 112 whose respective cathodes are commonly coupled at a node 122 as shown. The anode of diode 110 is coupled to a lead 120 of semiconductor package 21, and to line 17. The anode of diode 112 is coupled to a lead 124, which is operated at ground potential. Transient voltage suppressors 101–103 are coupled to lines 17 and 18 as shown. Transient voltage suppressors 100–101 protect data lines 17–18 when transient signal $V_{TR}$ has a negative polarity, while transient voltage suppressors 102–103 have the opposite orientation and consequently provide protection when $V_{TR}$ has a positive polarity.

Diode 110 comprises an avalanche diode having a reverse biased breakdown voltage of about 7.2 volts. As a result of the high doping levels needed to achieve such an avalanche breakdown voltage, diode 110 has a high junction capacitance. In order to reduce the capacitive load on line 17, diode 112 is formed to have a low junction capacitance. Since diodes 110 and 112 are in series, the capacitive load on line 17 is less than the capacitance of either diode 110 or 112. Diode 112 has a forward bias voltage drop of about 0.8 volts.

During normal operation, DATA1 logic swings are lower than the breakdown voltage of diode 110, so no current flows through transient voltage suppressor 100. During a transient event, if a negative transient signal $V_{TR}$ occurs on line 17 which is greater than eight volts, diode 110 breaks down, routing a current component of $V_{TR}$ to ground potential. As a result, the energy from $V_{TR}$ is dissipated in diodes 110 and 112 to limit the voltage on line 18 to about eight volts. Transient voltage suppressors 101–103 operate similarly.

Figure 2:
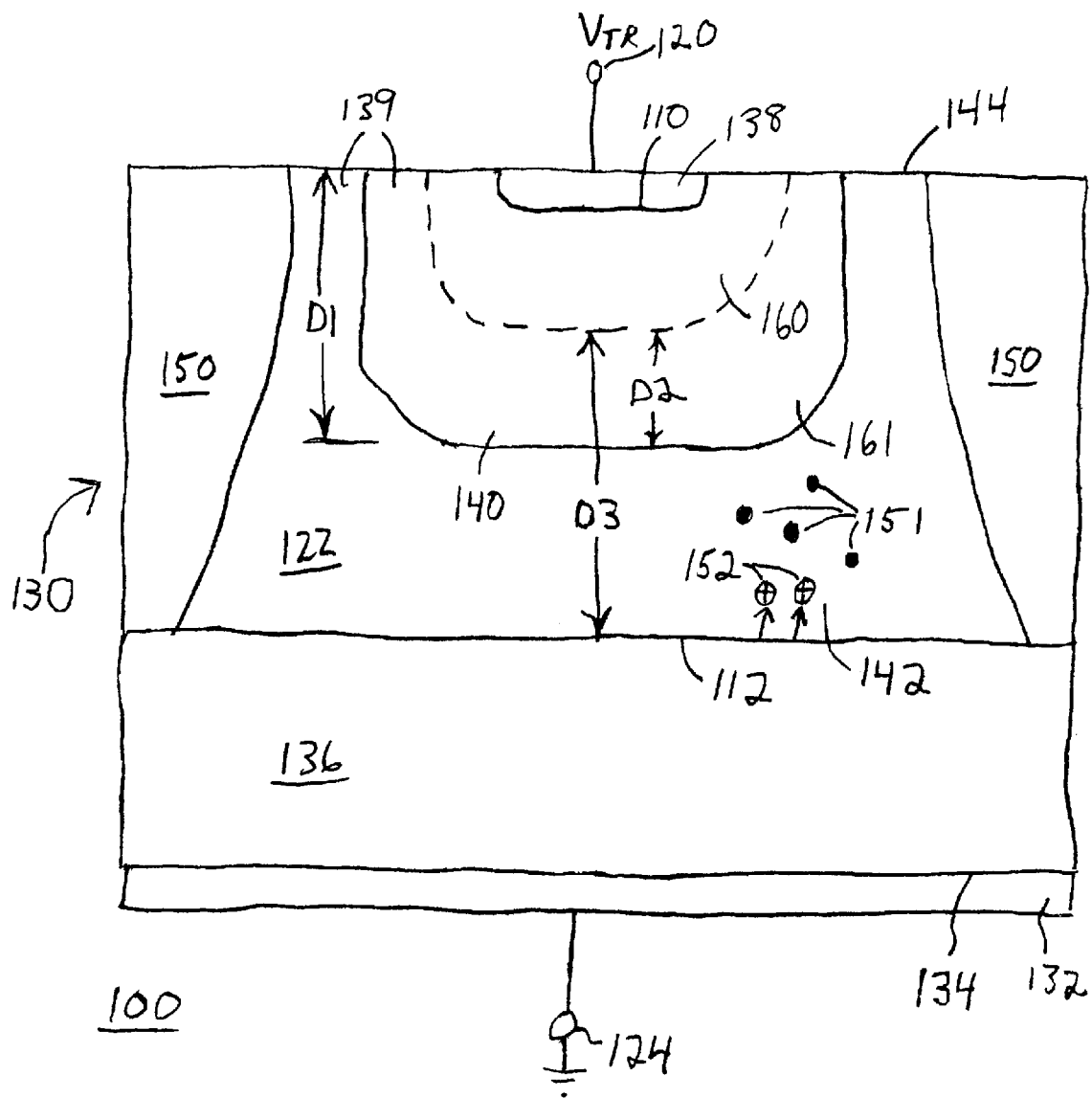
FIG. 2 shows a cross-sectional view of a transient suppressor in a first embodiment.

FIG. 2 shows a cross-sectional view of transient voltage suppressor 100 formed on a semiconductor die 130. Diode 110 is formed as a semiconductor junction 110 adjacent to doped regions 138 and 140 of semiconductor die 130. Diode 112 is formed as a semiconductor junction 112 adjacent to a doped epitaxial region 142 and a doped region designated as a layer 136 of semiconductor die 130.

Semiconductor die 130 includes a substrate designated as a layer 136 formed to have a p-type conductivity and a resistively from 0.02–0.2 ohm-centimeters, approximately. A metal layer 132 is formed on a surface 134 of semiconductor die 130 to provide an ohmic connection between layer 136 and lead 124.

Region 142 is formed to have an n-type conductivity and to extend from a surface 144 of semiconductor die 130 to a depth of ten to twenty micrometers, approximately, combining with layer 136 to form junction 112. Region 142 has a resistively from about twenty to about eighty ohm-centimeters, which results in junction 112 having a low junction capacitance to minimize the load on line 17.

A doped region 140 is formed by diffusing n-type dopants into region 142 from surface 144. Doped region 140 has a concentration from about $1.0*10^{18}$ atoms/centimeter$^3$ to about $1.0*10^{19}$ atoms/centimeter$^3$ at surface 144 and reaches the background concentration of region 142 at a depth D1 from about four micrometers to about fifteen micrometers from surface 144. Since doped region 140 and region 142 have the same conductivity type but different doping concentrations, they function electrically as a single doped region 139.

A doped region 138 is formed by introducing p-type dopants into semiconductor die 130 to a depth between one and three micrometer from surface 144, approximately, to combine with doped region 140 to form junction 110. Doped region 138 has a doping concentration between about $1.0*10^{19}$ atoms/centimeter$^3$ and about $1.0*10^{20}$ atoms/centimeter$^3$ at surface 144 and a concentration between about $1.0*10^{18}$ atoms/centimeter$^3$ and about $5.0*10^{18}$ atoms/centimeter$^3$ at junction 110.

An isolation region 150 is formed with p-type dopants to extend from surface 144 to a depth of about twenty-five micrometers. In one embodiment, isolation region 150 is formed at the edges of semiconductor die 130 to reduce leakage currents resulting from damage caused during wafer singulation. In an alternate embodiment, multiple transient voltage suppressors are formed on semiconductor die 130 by forming isolation region 150 to electrically isolate the commonly connected cathode regions of the multiple suppressors.

Junction 110 is doped to have a reverse bias breakdown voltage of 7.2 volts, and junction 112 is doped to have a forward bias voltage of 0.8 volts. Under reverse bias, junction 110 depletes into doped region 140 to form a depleted portion 160 and an undepleted portion 161 of doped region 140. In one embodiment, depleted portion 160 extends a distance (D1–D2) between about 0.5 micrometers and about 2.0 micrometers when junction 110 avalanches, so undepleted portion 161 has a typical width D2 of between two and thirteen micrometers. Note that width D2 is between two and thirteen micrometers when the doping concentrations are as described above. Under normal manufacturing variations and operating conditions, undepleted portion 161 has a width of at least one micrometer. Examples of such manufacturing variations and operating conditions are a deeper junction 110, a shallower junction 112, a more lightly doped region 140 and a high operating temperature.

In operation, when transient signal $V_{TR}$ induces a voltage of about negative eight volts from lead 120 to lead 124, junction 110 avalanches to generate a breakdown current within depleted portion 160 that flows from lead 120 across undepleted portion 161 and through forward biased junction 112 to lead 124. The current flow effectively dissipates the energy of transient signal $V_{TR}$ in junctions 110 and 112 to clamp the voltage level of lead 120 at about negative eight volts, thereby protecting devices coupled to lead 120 from damage due to excessive voltage levels.

Note that a portion of doped region 140 remains undepleted when the specified value of $V_{TR}$ is applied, i.e., undepleted portion 161. As a result, the breakdown voltage of junction 110 is essentially independent of the depth of region 142. Hence, region 142 can be manufactured with a broader tolerance than punchthrough devices, which deplete a region completely and break down when the depletion region reaches a region of the opposite conductivity type. By ensuring that the width of undepleted portion 161 does not shrink to zero, transient voltage suppressor 100 has a higher manufacturing yield and lower cost than punchthrough devices.

When junction 112 forward biases, minority carriers 152 are injected into region 142 to form a diffusion current component of transient signal $V_{TR}$ that flows between junction 112 and depleted portion 160. For example, since region 142 has n-type conductivity, holes are injected which diffuse toward depleted portion 160. A distance D3 from junction 112 to depleted portion 160 is preferably large enough to allow a substantial portion of minority carriers 152 to recombine in region 142 or in undepleted portion 161 so they do not reach depleted portion 160. In one embodiment, distance D3 has a length between six and sixteen micrometers when regions 140 and 142 have the doping concentrations described above.

Note that distances D1, D2 and D3 are functions of the doping concentrations of regions 138, 140, 142 and 136, and may therefore be modified when the doping concentrations change. For example, in an application in which a higher breakdown voltage is specified, the doping concentration of doped region 140 may be reduced while increasing the depth D1 to ensure that undepleted portion 161 is not reduced to zero when junction 110 avalanches. Similarly, if region 136 is doped more lightly to reduce the capacitance of junction 112, fewer minority carriers 152 are injected into region 142 so that distance D3 may be reduced.

As an alternative, semiconductor die 130 may be irradiated or doped with heavy metals such as gold during fabrication to produce trapping sites 151 or defects into regions 140 and 142 that reduce the minority carrier lifetime and increase the recombination rate. Such irradiation or impurity doping allows fabrication costs to be reduced because as the number of trapping sites 151 increases, shallower doped regions and shorter processing steps can be utilized. Trapping sites 151 may alternatively be formed by ion implantation, by forming region 142 with strain layers comprising germanium or another material, or by introducing voids in region 142 during epitaxial growth.

As a further alternative, region 142 may be formed as an n-type substrate whose thickness is between one hundred twenty-five and three hundred micrometers and whose doping is as described above. In such an embodiment, layer 136 is formed by introducing p-type dopants into the substrate from surface 134 to a depth between about one and fifteen micrometers and a surface concentration between about $1.0*10^{18}$ atoms/centimeter$^3$ and about $1.0*10^{19}$ atoms/centimeter$^3$. Other regions are formed as described above.

As yet a further alternative, transient voltage suppressor 100 may be formed as a device whose diodes have their anodes commonly connected, rather than their cathodes, by reversing the conductivity type of the doped regions.

Figure 3:
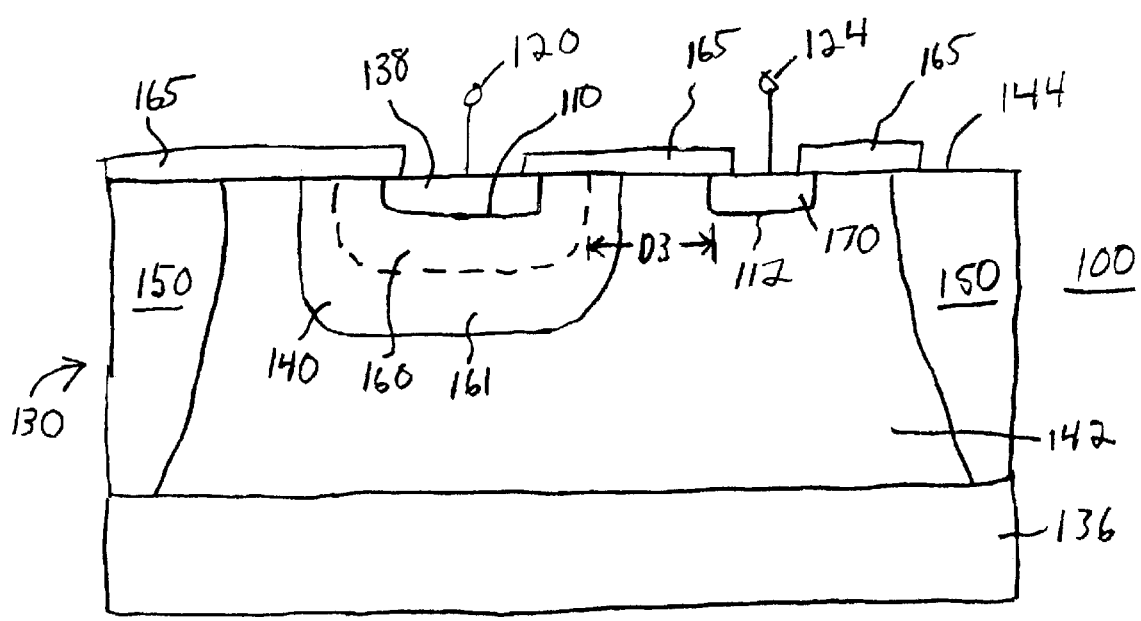
FIG. 3 shows a cross-sectional view of a transient suppressor in a second embodiment.

FIG. 3 shows a cross-sectional view of transient voltage suppressor 100 in a second embodiment. The characteristics and operation of the second embodiment of transient voltage suppressor 100 are similar to what is described in FIG. 2, except that lead 124 is coupled to a doped region 170 formed on surface 144 of semiconductor die 130. Hence, when transient voltage suppressor 100 breaks down, current flows laterally between lead 120 and lead 124. That is, current flows from lead 120 through doped region 138, across junction 110 and undepleted region 161 for routing across junction 112 and through doped regions 142 and 170 to lead 124.

Doped region 170 typically is formed during the same processing step as doped region 138 to have a depth between about one micrometer to about three micrometers and a p-type conductivity with a doping concentration between about $1.0*10^{19}$ atoms/centimeter$^3$ and about $1.0*10^{20}$ atoms/centimeter$^3$. Doped region is disposed a distance D3 from depleted portion 161 as described above. Alternatively, doped region 170 may be formed in a separate step to have a deeper junction, thereby reducing the current density across junction 112.

A dielectric layer is formed and patterned on surface 144 to produce passivation regions 165 as shown to protect exposed junctions. In one embodiment, passivation regions are formed with silicon dioxide.

Figure 4:
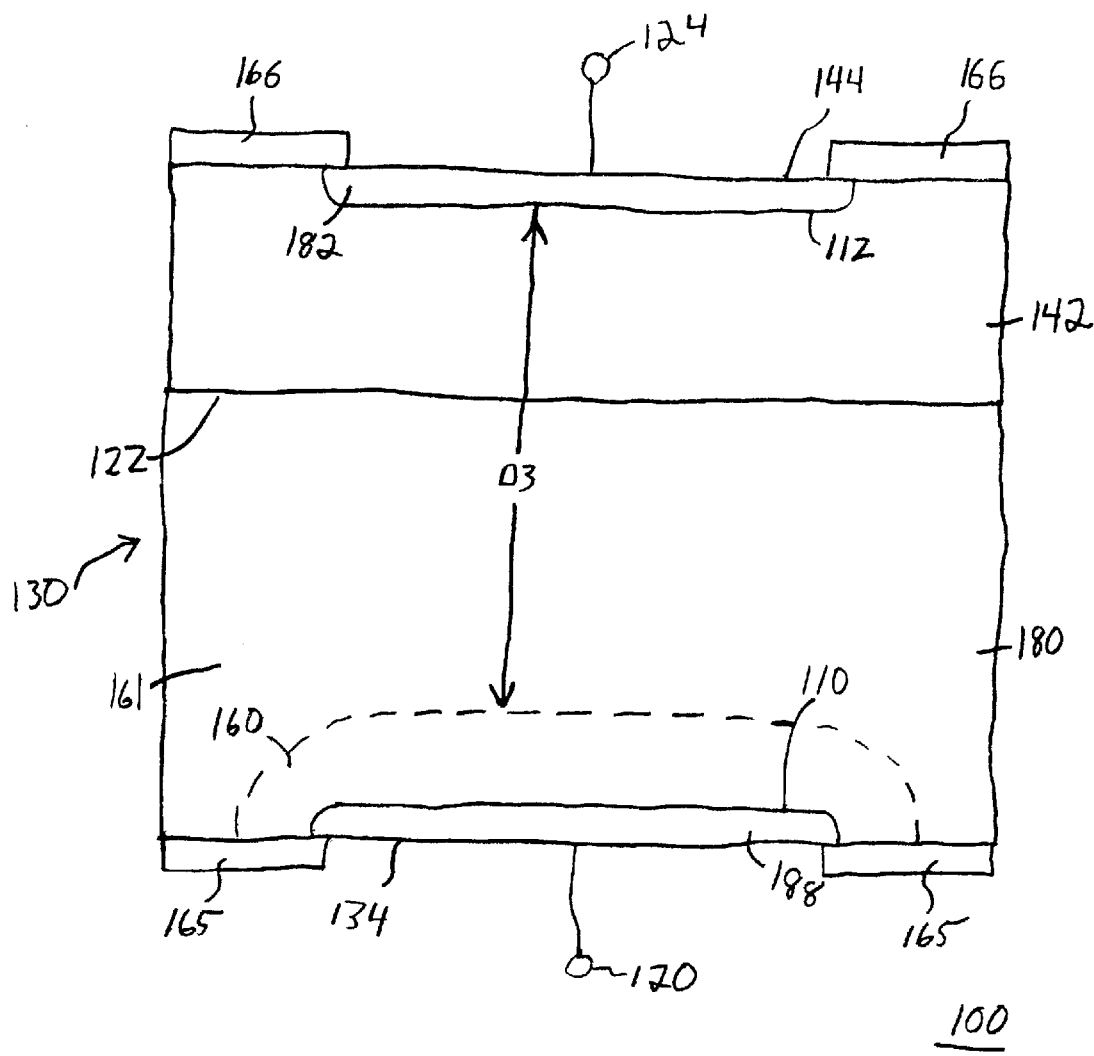
FIG. 4 shows a cross-sectional-view of a transient suppressor in a third embodiment.

FIG. 4 is a cross-sectional view of transient voltage suppressor 100 in a third embodiment. The characteristics and operation of the third embodiment are as previously described, taking into account that avalanching junction 110 is formed adjacent to surface 134 while forward biased junction 112 is formed adjacent to surface 144.

A substrate 180 of semiconductor die 130 comprises an n-type material having a doping concentration between about $1*10^{17}$ atoms/centimeter$^3$ and about $1*10^{19}$ atoms/centimeter$^3$. A doped region 188 is formed as a p-type material to a depth between one and three micrometers from surface 134, approximately, and having a doping concentration from about $1*10^{19}$ atoms/centimeter$^3$ to about $1*10^{20}$ atoms/centimeter$^3$. N-type epitaxial layer 142 is formed as described above.

A p-type doped region 182 is formed from surface 144 to a depth between about one and three micrometers and having a doping concentration from about $1*10^{19}$ atoms/centimeter$^3$ to about $1*10^{20}$ atoms/centimeter$^3$ to provide a good ohmic contact to lead 124. Doped region 188 is coupled to lead 120 while doped region 182 is coupled to lead 124.

Passivation regions 166 similar to passivation regions 165 are formed on surface 134 to protect exposed junctions.

Figure 5:
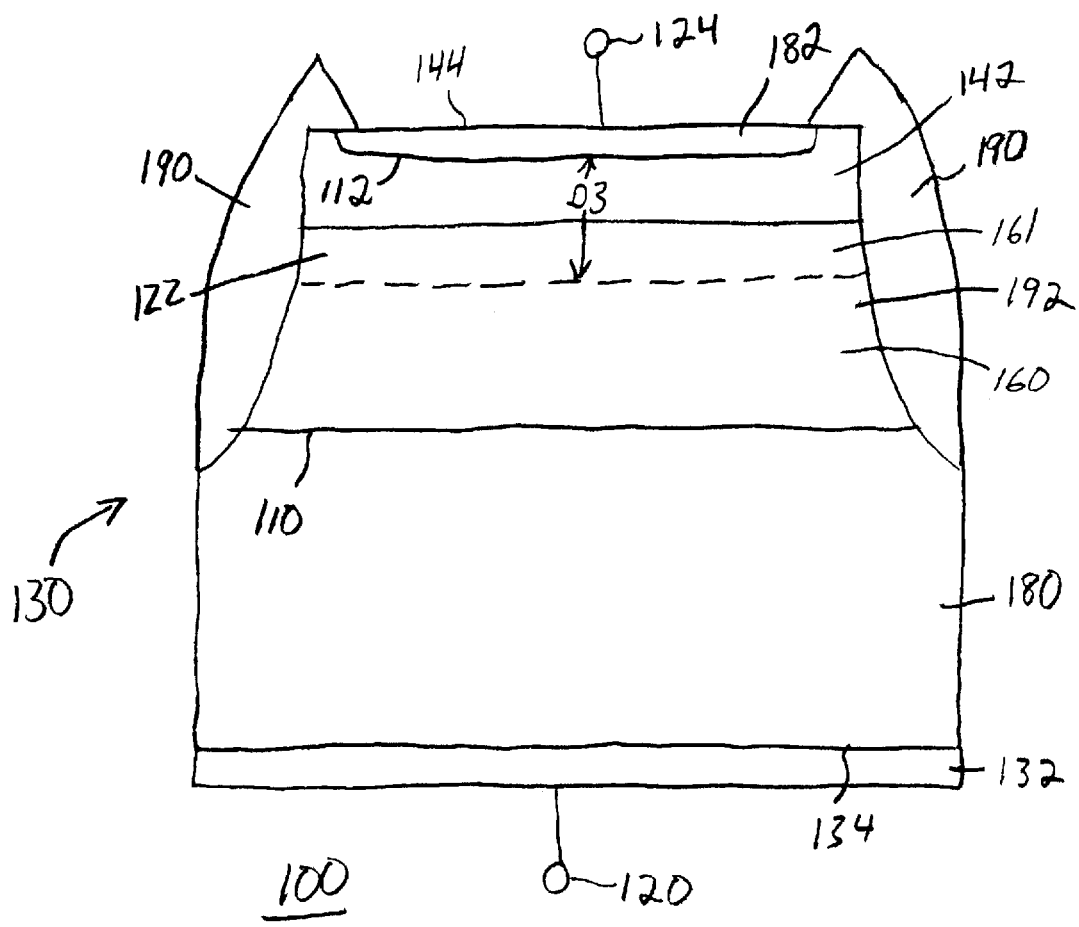
FIG. 5 shows a cross-sectional view of a transient suppressor in a fourth embodiment.

FIG. 5 shows a cross-sectional view of transient voltage suppressor 100 in a fourth embodiment. The characteristics and operation are similar to those of FIG. 2, except as follows.

A substrate 180 of semiconductor die 130 is formed as a p-type material having a doping concentration between about $1*10^{17}$ atoms/centimeter$^3$ and about $1*10^{19}$ atoms/centimeter$^3$. A doped region 192 is formed as an n-type epitaxial layer over substrate 180 with a thickness from about ten to about twenty micrometers and a doping concentration of between about $5.0*10^{17}$ atoms/centimeter$^3$ and about $5.0*10^{18}$ atoms/centimeter$^3$. Substrate 180 and doped region 192 combine to form avalanching junction 110.

Doped region 142 is formed to a thickness from about four and fourteen micrometers as described above. A doped region 182 is formed to have a p-type conductivity with a thickness between one and three micrometers, approximately, and a doping concentration from about $1.0*10^{19}$ atoms/centimeter$^3$ to about $1.0*10^{20}$ atoms/centimeter$^3$. Doped region 142 combines with doped region 182 to form forward biased junction 112.

Semiconductor die 130 is patterned and etched to form a trench that is filled with a dielectric material such as silicon dioxide to operate as an isolation region 190. In one embodiment, isolation region 190 circumscribes semiconductor die 130 to reduce the leakage currents of junctions that are exposed on the edges of semiconductor die 130. In an embodiment in which multiple transient voltage suppressors are formed on semiconductor die 130, isolation regions 190 are used to isolate the commonly connected nodes of each transient voltage suppressor.

By now it should be appreciated that the present invention provides a method of suppressing a transient signal. The transient signal is loaded with first and second junctions formed adjacent to a first doped region of a semiconductor die. The first junction breaks down to generate a current while the second junction forward biases to route the current across an undepleted portion of the first doped region and through the second junction. The method allows transient signals to be suppressed by using only a single semiconductor die that has an avalanching junction and a low capacitance junction, thereby reducing the cost of suppressing transients. When no transient signal is present, the method produces a load with a low capacitance, thereby maintaining a high system performance.

What is claimed is:

1. A method of limiting a transient signal, comprising the steps of:
   breaking down a first junction with the transient signal to generate a current flow across a first doped region formed at a first surface of a semiconductor substrate__ and lying adjacent to the first junction;
   forward biasing a second junction formed with a second doped region lying adjacent to the first doped region to route the current flow from an undepleted portion of the first doped region through the second junction; and
   electrically isolating the current with an isolation, region formed at the first surface and extending into the semiconductor substrate to the second doped region.

2. The method of claim 1, further comprising the step of routing the transient signal through the second doped region that forms the first junction with the first doped region.

3. The method of claim 2, wherein the step of routing includes the step of routing the transient signal from a material with a first doping concentration to a material with a second doping concentration that is lower than the first doping concentration.

4. The method of claim 3, further comprising the step of routing the current flow through a third doped region that forms the second junction with the first doped region.

5. The method of claim 1, wherein the step of breaking down includes the step of routing the current flow from the first junction a distance greater than seven micrometers across the first doped region.

6. The method of claim 1, wherein the step of forward biasing includes the steps of:
   injecting minority carriers of the current flow into the first doped region; and
   recombining the minority carriers with irradiation induced dislocations.

7. The method of claim 1, wherein the step of forward biasing includes the step of forward biasing the second junction with the transient signal.

8. The method of claim 1, further comprising the step of applying the transient signal across the first and second junctions.

9. The method of claim 1, further comprising the steps of:
   applying the transient signal across first and second nodes;
   routing the current flow from the first node to the first junction; and
   routing the current flow from the second junction to the second node.

10. The method of claim 8, wherein the step of applying includes the step of applying the transient signal across first and second leads of a semiconductor package.

11. A semiconductor device, comprising:

a semiconductor substrate having a first surface for forming a first doped region and a second surface for forming a second doped regions a first junction formed adjacent to the first doped region for breaking down in response to a transient signal to generate a current;

a second junction formed with the first and second doped regions for forward biasing in response to the transient signal to route the current across an undepleted portion of the first doped region and through the second junction; and an isolation region formed on the first surface and extending from the second doped region to an edge of the semiconductor substrate.

12. The semiconductor device of claim 11, further comprising a third doped region lying adjacent to the first doped region for forming the first junction.

13. The semiconductor device of claim 11, wherein the first doped region and the isolation region have opposite conductivity types.

14. A transient suppressor device, comprising:

a semiconductor die having a first surface for forming a first doped region;

a second doped region disposed at the first surface and forming a first junction with the first doped region that breaks down to produce a current in response to a transient signal; and a third doped region disposed adjacent to the first doped region to form a second junction that forward biases in response to the transient signal to route the current to a second surface of the semiconductor die, wherein the third doped region extends to the first surface for electrically isolating the transient suppressor device.

15. The transient suppressor device of claim 14, wherein the second and third doped regions have a first conductivity type and the second doped region has a second conductivity type.

16. The transient suppressor device of claim 14, wherein the first doped region includes an epitaxial portion adjacent to the third doped region and a diffused portion that surrounds the second doped region.

17. The transient suppressor device of claim 16, wherein a region of the diffused portion remains undepleted when the first junction breaks down.

18. The transient suppressor device of claim 14, further comprising a semiconductor package for housing the semiconductor die.

19. The transient suppressor device of claim 14, wherein the first doped region is formed to a depth of at least ten micrometers from the first surface.

20. The transient suppressor device of claim 14, where the third doped region is formed along an edge of the semiconductor die.

* * * * *